(12) United States Patent
Chiu et al.

(10) Patent No.: US 9,018,648 B2
(45) Date of Patent: Apr. 28, 2015

(54) LED PACKAGE STRUCTURE

(75) Inventors: Kuo-Ming Chiu, New Taipei (TW); Tsung-Chi Lee, New Taipei (TW); Chia-Hao Wu, Taipei (TW); Meng-Sung Chou, New Taipei (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 100 days.

(21) Appl. No.: 13/531,462

(22) Filed: Jun. 22, 2012

(65) Prior Publication Data

US 2013/0234177 A1 Sep. 12, 2013

(30) Foreign Application Priority Data

Mar. 12, 2012 (CN) .......................... 2012 1 0062079

(51) Int. Cl.
*H01L 33/00* (2010.01)
*H01L 25/075* (2006.01)
*H01L 33/60* (2010.01)
*H01L 33/64* (2010.01)

(52) U.S. Cl.
CPC ............. *H01L 25/0753* (2013.01); *H01L 33/60* (2013.01); *H01L 33/642* (2013.01); *H01L 2924/00* (2013.01); *H01L 2924/0002* (2013.01)

(58) Field of Classification Search
CPC ... H01L 25/0753; H01L 33/64; H01L 33/642; H01L 33/644
USPC .................... 257/79, 88, E33.075, 99; 438/28
See application file for complete search history.

(56) References Cited

U.S. PATENT DOCUMENTS

2007/0194333 A1* 8/2007 Son ................................. 257/88

* cited by examiner

*Primary Examiner* — Kenneth Parker
*Assistant Examiner* — John Lin
(74) *Attorney, Agent, or Firm* — Li & Cai Intellectual Property (USA) Office

(57) ABSTRACT

The present invention relates to a package structure for light-emitting diodes (LEDs). The package structure includes a substrate, a heat-dissipating structure disposed on the substrate, and a plurality of LED chips uniformly disposed on the heat-dissipating structure. The heat-dissipating structure has a central portion and at least one peripheral portion surrounding thereof. The central portion is capable of dissipating more heat than the peripheral portion. Thus, the temperature difference between the LED chips disposed on the central portion and the LED chips disposed on the peripheral portion can be reduced.

19 Claims, 6 Drawing Sheets

LED PACKAGE STRUCTURE

BACKGROUND OF THE INVENTION

1. Field of the Invention

The present invention relates to a package structure for light-emitting diodes (LEDs); more particularly to a package structure capable of reducing the temperature difference between the LED chips disposed on a central portion and the LED chips disposed on a peripheral portion.

2. Description of Related Art

Typically, for the multi-chip package structure, the temperature of the light-emitting chips disposed on the central region of substrate is higher than that of the light-emitting chips disposed on the peripheral region of the substrate. This temperature difference causes the forward bias of the light-emitting chips disposed on the central region to be less than that of the light-emitting chips disposed on the peripheral region. Hence, more current is flowed to the central region that reduces the reliability of the chips on the central region. Moreover, the higher temperature associated with the chips disposed on the central region also reduces the light emission efficiency of those chips. In other words, the chips disposed on the central region are less bright in comparing to the chips disposed on the peripheral region.

Thus, how to enhance heat dissipation for the central region of the substrate to reduce the abovementioned temperature difference is an important task.

SUMMARY OF THE INVENTION

The object of the present invention is to provide a package structure for light-emitting diodes (LEDs), where the package structure is capable of reducing the temperature difference between the LED chips disposed on a central portion of a substrate and the LED chips disposed on a peripheral portion of the substrate.

For the present invention, the package structure has at least one of the following characteristics to reduce the temperature difference between the LED chips disposed on the central portion and the LED chips disposed on the peripheral portion: the heat conductivity of the central portion of the heat-dissipating structure is greater than that of the peripheral portion of the heat-dissipating structure; the thickness of the central portion of the heat-dissipating structure is greater than that of the peripheral portion of the heat-dissipating structure; a plurality of progressive heat-conducting members having variable separation distances, variable density and variable sizes arranged in the substrate for heat conduction. Thus, the reliability, lighting efficiency, and brightness of the LED chips using the package structure of the present invention can be enhanced effectively.

In order to further appreciate the characteristics and technical contents of the present invention, references are hereunder made to the detailed descriptions and appended drawings in connection with the instant disclosure. However, the appended drawings are merely shown for exemplary purposes, rather than being used to restrict the scope of the present invention.

DETAILED DESCRIPTION OF THE EMBODIMENTS

[First Embodiment]

Figure 1A:
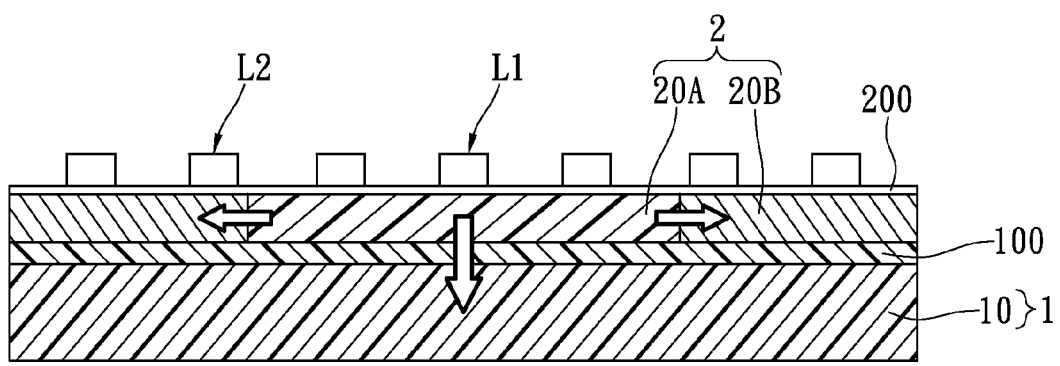
FIG. 1A shows a cross-sectional view of an LED package structure for a first embodiment of the present invention.

Please refer to FIG. 1A, which shows a cross-sectional view of an LED package structure for a first embodiment of the present invention. The package structure comprises a substrate 1, a heat-dissipating structure 2, and a plurality of LED chips L1, L2. The heat-dissipating structure 2 is arranged on the substrate 1, where the heat-dissipating structure 2 includes an inner portion and at least one outer portion. The inner portion is referred herein as a central portion 20A, while the outer portion is referred herein as a peripheral portion 20B in connection with and surrounding the central portion 20A. The central portion 20A is capable of dissipating more heat than the peripheral portion 20B. Whereas the LED chips L1, L2 are arranged uniformly on the heat-dissipating structure 2.

Specifically, the substrate 1 may be a metal substrate 10 having a dielectric layer 100 formed on a surface thereof. The metal substrate 10 can be made of aluminum or any other metallic material having high heat-dissipating capability. Whereas the dielectric layer 100 can be made of any insulating material capable of providing electrical insulation. The central portion 20A is generally located in the central region of the heat-dissipating structure 2. The dielectric layer 100 is covered by the central and peripheral portions 20A, 20B. The central and peripheral portions 20A, 20B can be made of copper or any other metallic material having excellent heat conductivity. A reflective layer 200 is further disposed on the central and peripheral portions 20A, 20B. The LED chips L1, L2 are disposed on the reflective layer 200, where the reflective layer 200 can be made of silver material or any other material having excellent light reflectivity. Alternatively, the reflective layer 200 may only be disposed around the LED chips L1, L2, where the LED chips L1, L2 are not disposed directly on the reflective layer 200. It is worth noting that the aforementioned material choice for the metal substrate 10, the dielectric layer 100, the central portion 20A, the peripheral portion 20B, and the reflective layer 200 are not restricted by the instant embodiment. For example, the substrate 1 may be constructed of a ceramic material without having the dielectric layer 100. In other words, the metal substrate 10 having the dielectric layer 100 can be replaced by the ceramic substrate. Therefore, the ceramic substrate can be served as a carrier for carrying the heat-dissipating structure 2 having the central portion 20A and the peripheral portion 20B.

Furthermore, heat conductivity can be used to describe the heat dissipating capability. For example, the central portion 20A may have higher heat conductivity than that of the peripheral portion 20B. This structure implies that the central portion 20A has a better heat-dissipating ability than the peripheral portion 20B. Because the central portion 20A has a higher heat conductivity, heat generated by the LED chips L1 disposed on the central portion 20A can be conducted more easily and more quickly to the substrate 1 (as shown by the downward arrow in FIG. 1A that indicates the main heat conducting path for the LED chips L1) than the LED chips L2 disposed on the peripheral portion 20B. In addition, heat generated from the LED chips L1 can be conducted more efficiently to the peripheral portion 20B through the central portion 20A (as shown by the lateral arrows in FIG. 1A that indicates the secondary heat conducting path for the LED chips L1).

When in operation, heat generated by the LED chips L1 disposed on the central portion 20A is more than that of the LED chips L2 disposed on the peripheral portion 20B. However, because the central portion 20A has a higher heat conductivity, heat generated by the LED chips L1 disposed on the central portion 20A can be conducted more easily and more quickly to the substrate 1 than the LED chips L2 disposed on the peripheral portion 20B. In addition, heat generated by the LED chips L1 can be conducted more efficiently to the peripheral portion 20B through the central portion 20A. Thus, the temperature difference that exists between the LED chips L1 disposed on the central portion 20A and the LED chips L2 disposed on the peripheral portion 20B (i.e., the temperature difference between the LED chips L1 disposed on the inner portion of the heat-dissipating structure 2 and the LED chips L2 disposed on the outer portion of the heat-dissipating structure 2) can be reduced.

It is worth noting that the heat-dissipating structure 2 of the present invention is not restricted to only utilizing two heat conducting materials having different heat conductivity for reducing the temperature difference. Three or more heat conducting materials having different heat conductivity may be used for reducing the temperature difference between the LED chips L1 disposed on the inner portion and the LED chips L2 disposed on the outer portion.

Figure 1B:
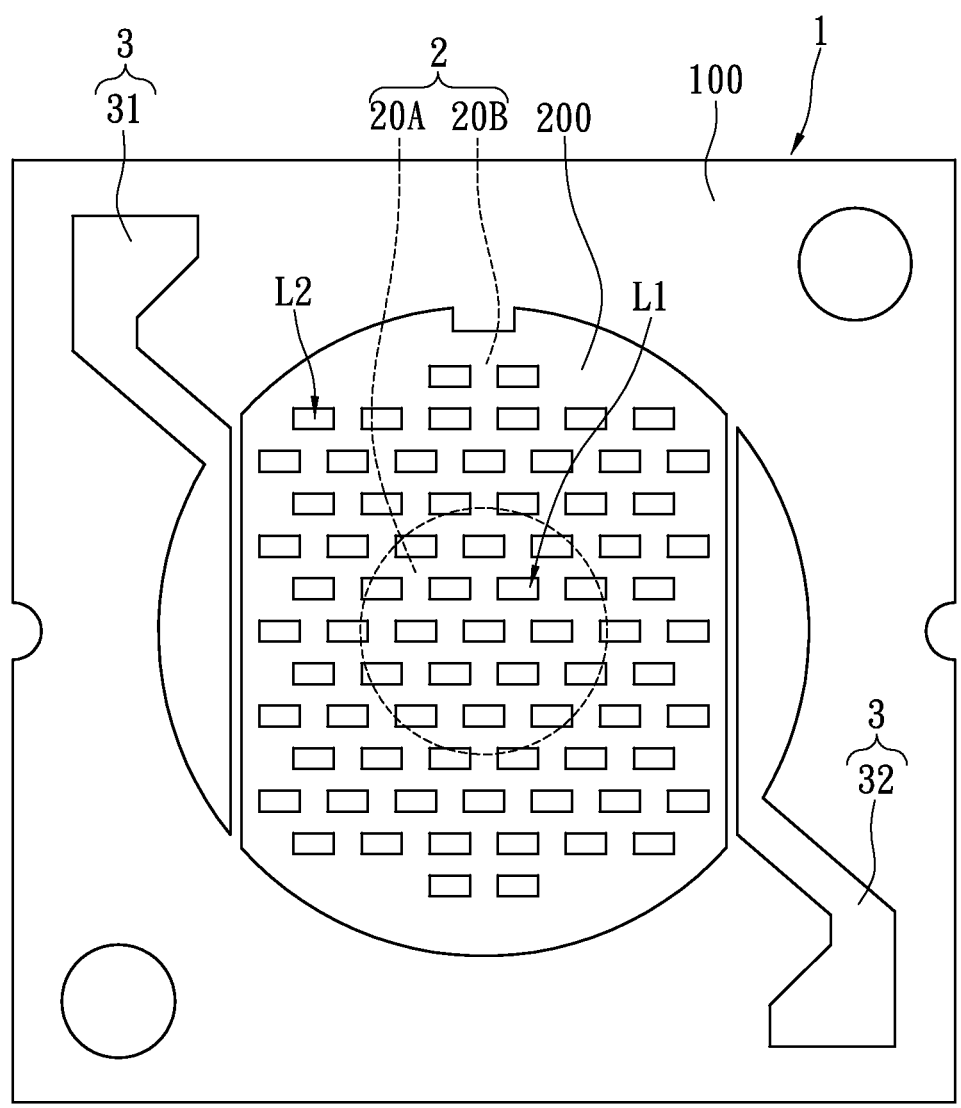
FIG. 1B is a top view showing the package structure in FIG. 1A as a carrier for the LED chips.
Figure 1C:
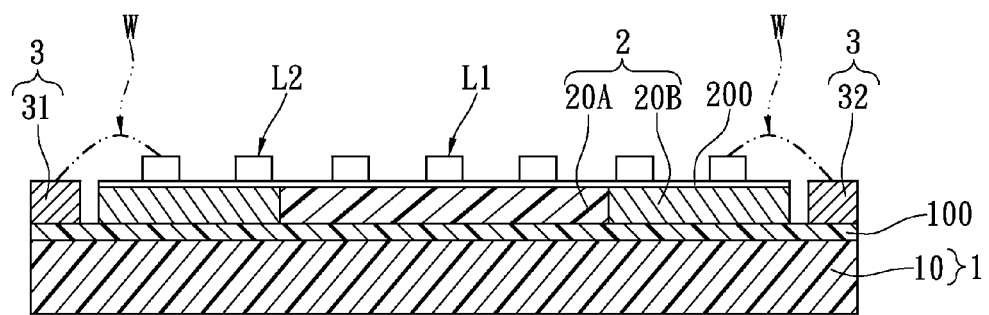
FIG. 1C is a cross-sectional view of the package structure in FIG. 1B.

Please refer to FIGS. 1B and 1C, which show a top view and a cross-sectional view having a pair of electrodes 3 disposed on the substrate for the present invention, respectively. As shown in the figures, the package structure of the instant embodiment further includes the electrodes 3. The electrodes 3 are disposed on the dielectric layer 100 of the metal substrate 10. Each of the electrodes 3 is spaced apart from the heat-dissipating structure 2 by a pre-determined distance. The electrodes 3 include a positive terminal 31 and a negative terminal 32. Each of the LED chips L1, L2 is electrically connected to the positive and negative terminals 31, 32.

The electrical connection is described in further detail hereinbelow. The heat-dissipating structure 2 may be disposed between the positive and negative terminals 31, 32. For the LED chips L1, L2 disposed on the reflective layer 200, conductive wires (not shown) may be used to electrically interconnecting the LED chips L1, L2 in series, parallel, or both. Then, conductive wires W (denoted by the dashed lines in FIG. 1C) are used to connect the closest LED chip L2 to the positive terminal 31 and the closest LED chip L2 to the negative terminal 32 for establishing electrical connection. Thus, electrical connection is established for all of the LED chips L1, L2 with the positive and negative terminals 31, 32.

The LED chips L1, L2 may be uniformly or randomly disposed on the heat-dissipating structure 2. The uniform arrangement includes an array, an interlaced pattern, or a honeycomb pattern. Depending on specific operational requirement or practical needs, the pattern of arrangement for the LED chips L1, L2 is not limited to the exemplary embodiment provided herein.

Figure 1D:
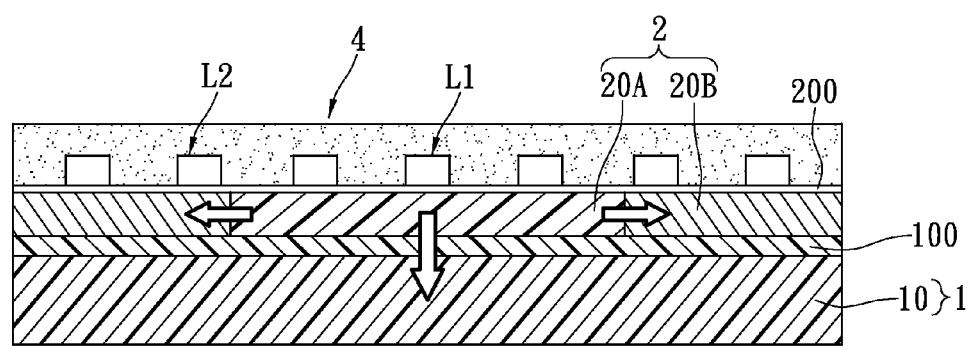
FIG. 1D is a cross-sectional view of the package structure in FIG. 1A having a fluorescent layer for covering the LED chips.

Please refer to FIG. 1D, where the package structure of the instant embodiment can further include a fluorescent layer 4. This fluorescent layer 4 is formed directly on the heat-dissipating structure 2 and covers the LED chips L1, L2 for the purpose of mixing light. For example, when the LED chips L1, L2 emit a blue light, a white light can be obtained as the blue light passes through the fluorescent layer 4.

[Second Embodiment]

Figure 2:
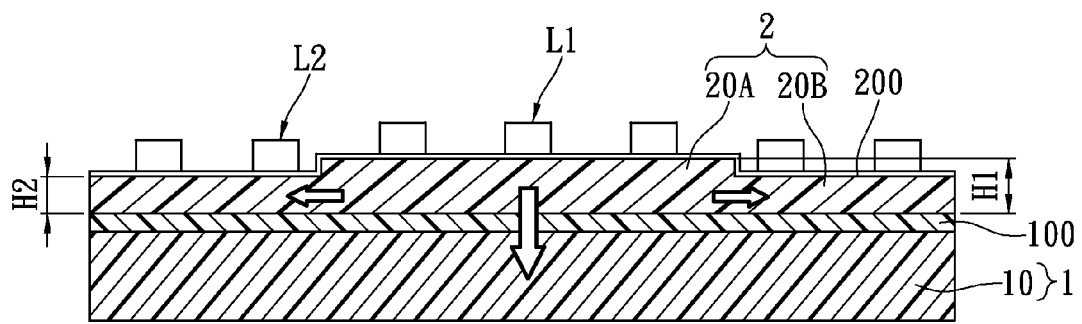
FIG. 2 shows a cross-sectional view of an LED package structure for a second embodiment of the present invention.

Please refer to FIG. 2, which is a cross-sectional view showing an LED package structure for a second embodiment of the instant disclosure. The package structure for the instant embodiment includes the substrate 1, the heat-dissipating structure 2, and the LED chips L1, L2. In comparing FIG. 2 with FIG. 1A, the main difference between the first and second embodiments is that: the central portion 20A has a thickness H1 that is greater than a thickness H2 of the peripheral portion 20B while the heat conductivity for the central portion 20A and the peripheral portion 20B may be the same. Thus, the central portion 20A with thicker thickness can have better heat-dissipating capacity to dissipate more heat than the peripheral portion 20B with thinner thickness.

Since the central and peripheral portions 20A, 20B have the same heat conductivity, both portions can be constructed integrally in one-piece using the same metallic material. Next, to allow the thickness H1 of the central portion 20A to be greater than the thickness H2 of the peripheral portion 20B, one of the two following manufacturing methods can be employed in the present invention. First, the thickness H2 of the peripheral portion 20B is fixed, while additional coating processes are performed to increase the thickness of the central portion 20A. Alternatively, the thickness H1 of the central portion 20A is fixed, while an etching process is employed to reduce the thickness of the peripheral portion 20B. Nevertheless, the design of varying the thicknesses between the central and peripheral portions 20A, 20B of the heat-dissipating structure 2 is not limited to the exemplary embodiment provided herein.

For the instant embodiment, the heat dissipating capability of the package structure is based on the thickness difference between different portions of the heat-dissipating structure 2. For example, the central portion 20A has a greater thickness than that of the peripheral portion 20B. This structure implies that the central portion 20A has a better heat-dissipating ability than that of the peripheral portion 20B. Because the central portion 20A has a greater thickness, heat generated by the LED chips L1 disposed on the central portion 20A can be conducted more efficiently to the peripheral portion 20B through the central portion 20A (as shown by the lateral arrows in FIG. 2 that indicates the main heat conducting path for the LED chips L1). In addition, heat generated from the LED chips L1 can be conducted more easily and more quickly from the heat-dissipating structure 2 to the substrate 1 (as shown by the downward arrow in FIG. 2 that indicates the secondary heat conducting path for the LED chips L1) than the LED chips L2 disposed on the peripheral portion 20B.

When in operation, heat generated by the LED chips L1 disposed on the central portion 20A is more than that of generated by the LED chips L2 disposed on the peripheral portion 20B. However, because the central portion 20A has a greater thickness, heat generated by the LED chips L1 disposed on the central portion 20A can be conducted more efficiently from the central portions 20A to the peripheral portion 20B. In addition, heat generated from the LED chips L1 can be conducted more easily and more quickly to the peripheral portion 20B through the central portion 20A. Thus, the temperature difference that exists between the LED chips L1 disposed on the central portion 20A and the LED chips L2 disposed on the peripheral portion 20B can be reduced. It is worth noting that the heat-dissipating structure 2 of the present invention is not restricted to only utilizing two different thicknesses for reducing the temperature difference. Three or more different thicknesses may be used.

Moreover, for the instant embodiment, the central and peripheral portions 20A, 20B may have different heat conductivity. In other words, the first embodiment (i.e., the heat conductivity of the central portion is greater than that of the peripheral portion) and second embodiment (i.e., the thickness H1 of the central portion is greater than the thickness H2 of the peripheral portion) can be combined for the present invention.

[Third Embodiment]

Figure 3:
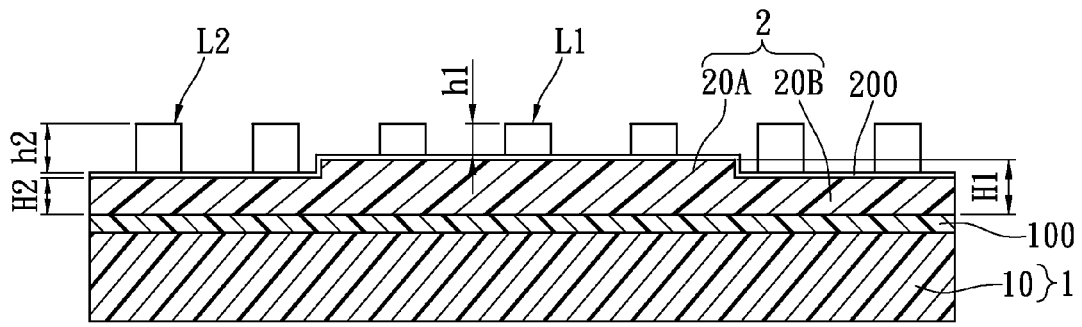
FIG. 3 shows a cross-sectional view of an LED package structure for a third embodiment of the present invention.

Please refer to FIG. 3, which is a cross-sectional view showing an LED package structure for a third embodiment of the instant disclosure. The package structure for the instant embodiment includes the substrate 1, the heat-dissipating structure 2, and the LED chips L1, L2. In comparing FIG. 3 with FIG. 2, the main difference between the instant and the previous embodiment is that: each of the LED chips L1 disposed on the central portion 20A has a thickness h1 smaller than a thickness h2 of each LED chips L2 disposed on the peripheral portion 20B. Particularly, the total thickness defined by the thickness h1 of the LED chip L1 and the thickness H1 of the central portion 20A of the heat-dissipating structure 2 (i.e., h1+H1) is substantially the same as the total thickness defined by the thickness h2 of the LED chip L2 and the thickness H2 of the peripheral portion 20B of the heat-dissipating structure 2 (i.e., h2+H2).

Moreover, the LED chips L1 having smaller thickness h1 also have lower heat resistance than that of the LED chips L2 having thicker thickness h2. Thus, the combination of lower heat resistance for the LED chips L1 along with the thickness difference described in the second embodiment and/or the heat conductivity difference provided in the first embodiment can further reduce the temperature difference between the LED chips L1 disposed on the central portion 20A and the LED chips L2 disposed on the peripheral portion 20B. In addition, the upper surfaces of the LED chips L1 having smaller thickness h1 and the upper surfaces of the LED chips L2 having larger thickness h2 are substantially coplanar. Thus, the light emitted from the LED chips L1, L2 can have better light pattern.

[Fourth Embodiment]

Figure 4A:
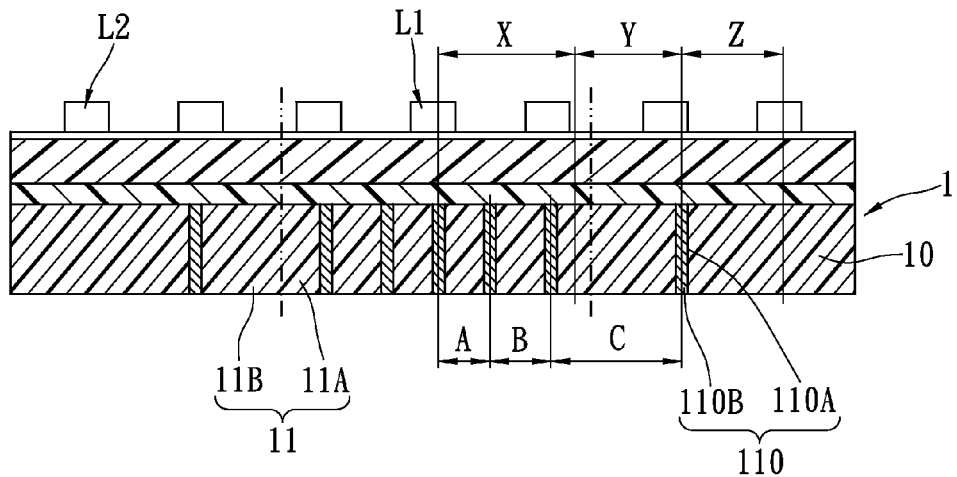
FIG. 4A shows a cross-sectional view of an LED package structure for a fourth embodiment of the present invention.

Please refer to FIG. 4A, which is a cross-sectional view showing an LED package structure for a fourth embodiment of the instant disclosure. The package structure for the instant embodiment includes the substrate 1 topped by the LED chips L1, L2. In comparing FIG. 4A with FIG. 1A, the main difference between the fourth and first embodiment is that: a heat-dissipating structure 11 is disposed in the substrate 1. The heat-dissipating structure 11 has a central portion 11A and at least one peripheral portion 11B surrounding the central portion 11A. The central portion 11A can dissipate more heat than the peripheral portion 11B.

The heat-dissipating structure 11 is defined by a plurality of heat-conducting members 110 formed in the substrate 1. Specifically, each of the heat-conducting members 110 is a solid heat-conducting cylinder defined by a thru-hole 110A completely filled by a heat-conducting material 110B (such as metal). The heat-conducting members 110 are distributed in the central and peripheral portions 11A, 11B. The heat-conducting members 110 are separately arranged from each other and penetrate the metal substrate 10. Alternatively, the heat-conducting members 110 may not totally penetrate the metal substrate 10 (not shown). The heat-conducting members 110 can be arranged in a direction from a center of the metal substrate 10 radially outward toward the outer edge of the metal substrate 10, or vice versa, so that the heat-conducting members may have a gradual arrangement within the metal substrate 10.

A temperature difference of 5° C. is used as a division criterion, and thus three heat-dissipating regions X, Y, Z are defined on the package structure as shown in FIG. 4A. The radial distance of the respective heat-dissipating region gradually decreases from the center of the package structure toward the outer edge thereof (i.e., in a direction from the heat-dissipating region X toward the heat-dissipating region Z). For example, the ratio of the radial distance among the heat-dissipating regions is X:Y:Z=5:4:3. The separation distance (A, B, C) among the heat-conducting members 110 increases gradually from the center toward the outer edge of the metal substrate 10 (e.g., A:B:C=3:4:5), while the size of each heat-conducting member 110 is substantially the same. Thus, more heat can be dissipated for the LED chips L1 disposed on the central portion 11A than for the LED chips L2 disposed on the peripheral portion 11B by the heat-conducting members 110 having a gradual arrangement within the metal substrate 10. Accordingly, the temperature difference between the LED chips L1 and the LED chips L2 can be reduced.

It is worth noting that the instant embodiment can also be combined with the design of using two or more heat conducting materials having different heat conductivity in the first embodiment and/or the design of using different thickness at the inner and outer portions in the second embodiment to further reduce the temperature difference between the LED chips L1 and the LED chips L2. In other words, the design of using the heat-conducting members 110 having varying separation distances is also applicable to the first and second embodiments.

Figure 4B:
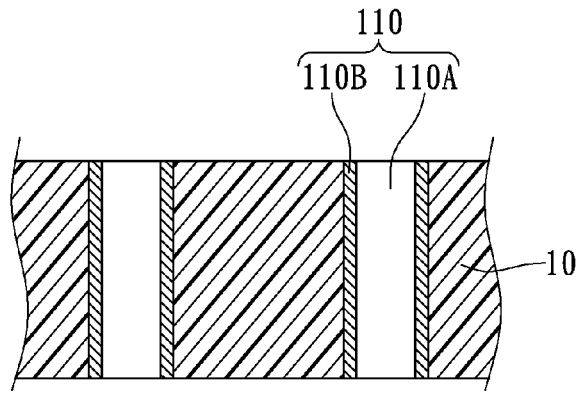
FIG. 4B is a cross-sectional view showing another type of heat-conducting member utilized by the package structure in FIG. 4A.
Figure 4C:
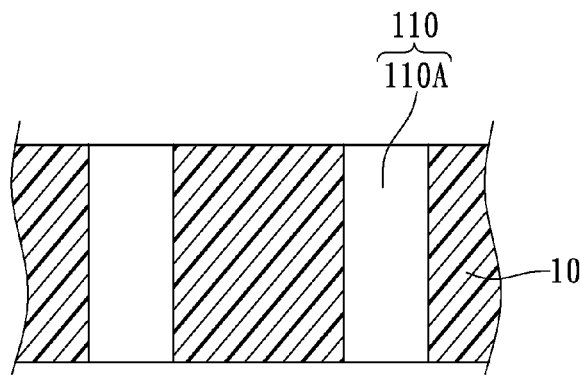
FIG. 4C is a cross-sectional view showing still another type of heat-conducting member utilized by the package structure in FIG. 4A.

Moreover, as shown in FIG. 4B, each of the heat-conducting members 110 may be a hollow heat-conducting cylinder constructed by coating the heat-conducting material 110B on the inner surface of the thru-hole 110A. Furthermore, as shown in FIG. 4C, each of the heat-conducting members 110 may simply be the thru-hole 110A without being filled or coated by the heat-conducting material 110B.

[Fifth Embodiment]

Figure 5:
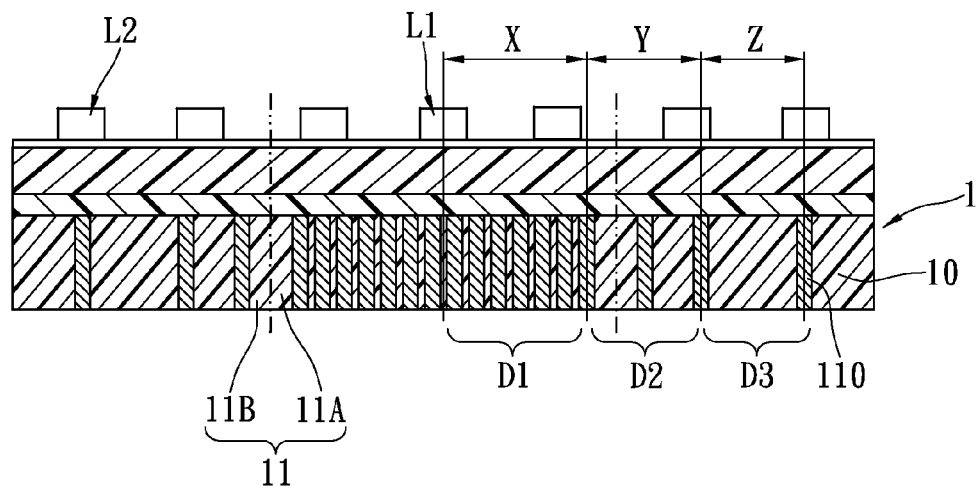
FIG. 5 shows a cross-sectional view of an LED package structure for a fifth embodiment of the present invention.

Please refer to FIG. 5, which is a cross-sectional view showing an LED package structure for a fifth embodiment of the instant disclosure. The package structure for the instant embodiment includes the substrate 1 topped directly by the LED chips L1, L2. In comparing FIG. 5 with FIG. 4A, the main difference between the fifth and fourth embodiment is that: the density (D1, D2, D3) of the heat-conducting members 110 within the metal substrate 10 gradually increases radially from the outer edge of the metal substrate 10 toward the center thereof.

Similar to the fourth embodiment, a temperature difference of 5° C. is used as a division criterion, and thus three heat-dissipating regions X, Y, Z are defined on the package structure as shown in FIG. 5. The radial distance of the respective heat-dissipating region X, Y, Z gradually decreases from the center of the package structure toward the outer edge thereof (i.e., in a direction from the heat-dissipating region X toward the heat-dissipating region Z). For example, the ratio of the radial distance among the heat-dissipating regions X, Y, Z is X:Y:Z=5:4:3. The density (D1, D2, and D3) of the heat-conducting member 110 within the metal substrate 10 gradually increases from the heat-dissipating region Z toward the heat-dissipating region X (e.g.: D1:D2:D3=6.5:2:1), while the size between each heat-conducting member 110 is substantially the same. Thus, more heat can be dissipated for the LED chips L1 disposed on the central portion 11A than for the LED chips L2 disposed on the peripheral portion 11B. Accordingly, the temperature difference between the LED chips L1 and the LED chips L2 can be reduced. In other words, as shown in FIG. 5, the relationship between the number of heat-conducting members 110 arranged in the heat-dissipating regions X, Y, Z is described by the following expression, namely, X:Y:Z=6.5:2:1. That is to say, there are 6.5 heat-conducting members in the heat-dissipating region X, there are 2 heat-conducting members in the heat-dissipating region Y, and there is 1 heat-conducting member in the heat-dissipating region Z. Accordingly, more heat can be dissipated for the LED chips L1 disposed on the central portion 11A than for the LED chips L2 disposed on the peripheral portion 11B by the heat-dissipating members 110 having a gradual density variation among the heat-dissipating regions X, Y, Z of the metal substrate 10.

Likewise, it is worth noting that the instant embodiment can also be combined with the design of different heat conductivities in the first embodiment and/or the design of the thickness difference in the second embodiment to further reduce the temperature difference between the LED chips L1 and the LED chips L2. In other words, the design of using the heat-conducting members 110 having gradual density variation among the heat-dissipating regions X, Y, Z of the metal substrate 110 in the instant embodiment is also applicable to the first and second embodiments.

[Sixth Embodiment]

Figure 6:
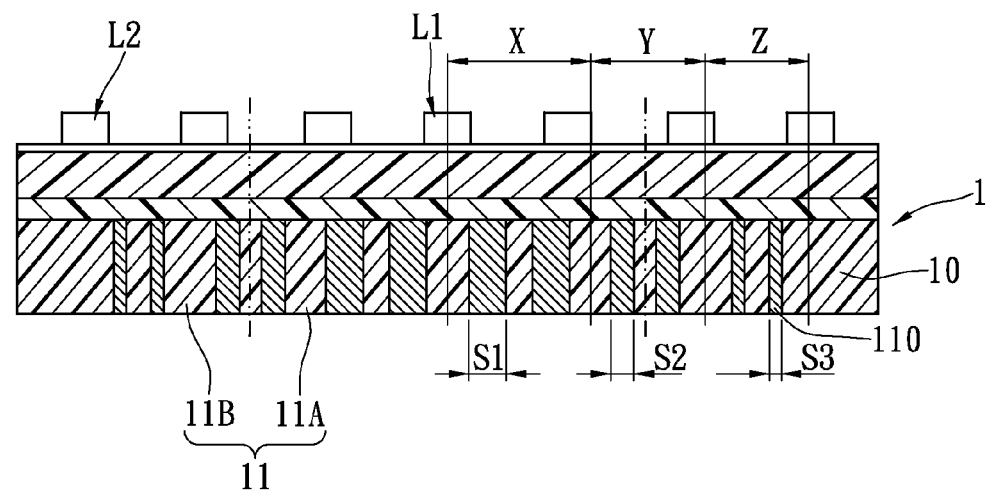
FIG. 6 shows a cross-sectional view of an LED package structure for a sixth embodiment of the present invention.

Please refer to FIG. 6, which is a cross-sectional view showing an LED package structure for a sixth embodiment of the instant disclosure. The package structure for the instant embodiment includes the substrate 1 topped directly by the LED chips L1, L2. In comparing FIG. 6 with FIG. 5, the main difference between the sixth and fifth embodiment is that: the sizes (S1, S2, S3) of the heat-conducting members 110 increase gradually in a direction from the outer edge of the metal substrate 10 toward the center of the metal substrate 10.

Again, a temperature difference of 5° C. is used as a division criterion, and thus three heat-dissipating regions X, Y, Z are defined on the package structure as shown in FIG. 6. The radial distance of the respective heat-dissipating region X, Y, Z gradually decreases from the center of the package structure toward the outer edge thereof (i.e., in a direction from the heat-dissipating region X toward the heat-dissipating region Z). For example, the ratio of the radial distance among the heat-dissipating regions X, Y, Z is X:Y:Z=5:4:3. For the instant embodiment, the heat-conducting members 110 have different sizes. Specifically, the size (S1, S2, S3) of the heat-conducting member 110 gradually increases in a direction from the heat-dissipating region Z toward the heat-dissipating region X (e.g.: S1:S2:S3=5:4:3). Thus, more heat can be dissipated for the LED chips L1 disposed on the central portion 11A than for the LED chips L2 disposed on the peripheral portion 11B by the heat-dissipating members 110 having a gradual size distribution within the metal substrate. Accordingly, the temperature difference between the LED chips L1 and the LED chips L2 can be reduced.

Likewise, it is worth noting that the instant embodiment can also be combined with the design of different heat conductivities in the first embodiment and/or the design of the thickness difference in the second embodiment to further reduce the temperature difference between the LED chips L1 and the LED chips L2. In other words, the design of using heat-conducting members 110 having variable sizes of the instant embodiment is also applicable to the first and second embodiments.

[Advantages]

Based on the foregoing, the present invention utilizes the design of different heat conductivities of the heat-dissipating structure, the design of thickness difference of the heat-dissipating structure, and/or the design of progressive heat-conducting members to effectively reduce the temperature difference between the LED chips disposed on the central portion of the package structure and the LED chips disposed on the peripheral portion of the package structure. Thus, the reliability, lighting efficiency, and brightness of the LED chips supported by the package structure can be enhanced.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A package structure for light-emitting diodes (LEDs), comprising:
   a substrate having an inner portion and at least one outer portion;
   a plurality of heat-conducting members disposed in the substrate, wherein some of the heat-conducting members located in the inner portion is capable of dissipating more heat than the other heat-conducting members located in the outer portion;
   a heat-dissipating structure disposed on the substrate;
   a pair of electrodes having a positive terminal and a negative terminal and disposed on the substrate; and
   a plurality of LED chips disposed on the heat-dissipating structure and electrically connected to the positive terminal and the negative terminal, the plurality of LED chips having at least one first LED chip and at least one second LED chip, the first LED chip disposed above the inner portion, the second LED chip disposed above the outer portion, wherein the plurality of heat-conducting members is capable of reducing the temperature difference between the first LED chip and the second LED chip when the first and second LED chips are emitted;
   wherein a heat conduction path is substantially constructed by the heat-dissipating structure and the plurality of heat-conducting members, an electrical conduction path is constructed by the positive terminal and the negative terminal, thus the heat conduction path and the electrical conduction path are separated from each other.

2. The package structure of claim 1, wherein the heat-conducting members having the same size are spaced apart from each other, and the spacing of the heat-conducting members has a gradual reduction from an outer edge of the substrate toward a center of the substrate.

3. The package structure for light-emitting diodes (LEDs) of claim 1, wherein a plurality of heat-conducting members having the same size are disposed in the substrate and spaced apart from each other, the number of heat-conducting members in the inner portion is greater than that of in the outer portion.

4. The package structure for light-emitting diodes (LEDs) of claim 1, wherein a plurality of heat-conducting members are disposed in the substrate and spaced apart from each other, the size of the heat-conducting members increases gradually from an outer edge of the substrate toward a center of the substrate.

5. The package structure of claim 1, further comprising a reflective layer disposed selectively on the substrate for reflecting light generated by the LED chips.

6. The package structure of claim 1, wherein the inner portion is defined as a central portion and the outer portion is defined as a peripheral portion surrounding the central portion, the central portion having a heat conductivity greater than that of the peripheral portion.

7. The package structure for light-emitting diodes (LEDs) of claim 1, wherein the inner portion is defined as a central portion and the outer portion is defined as a peripheral portion surrounding the central portion, the central portion having a thickness greater than that of the peripheral portion.

8. The package structure for light-emitting diodes (LEDs) of claim 7, wherein the first LED chip disposed on the central portion having a thickness smaller than that of the second LED chip disposed on the peripheral portion.

9. The package structure for light-emitting diodes (LEDs) of claim 8, wherein a total thickness defined by the thickness of the first LED chip disposed on the central portion and the thickness of the central portion of the heat-dissipating structure is substantially the same as a total thickness defined by the thickness of the second LED chip disposed on the peripheral portion and the thickness of the peripheral portion of the heat-dissipating structure.

10. The package structure of claim 1, further comprising a fluorescent layer covering the LED chips and mixing light generated from the LED chips.

11. A package structure for light-emitting diodes (LEDs), comprising:
a substrate having a plurality of heat-conducting members, wherein the substrate has a central portion and at least one peripheral portion surrounding thereof, wherein some of the heat-conducting members located in the central portion is capable of dissipating more heat than the other heat-conducting members located in the peripheral portion;
a pair of electrodes having a positive terminal and a negative terminal and disposed on the substrate; and
a plurality of LED chips disposed on the substrate and electrically connected to the positive terminal and the negative terminal, the plurality of LED chips having at least one first LED chip and at least one second LED chip, the first LED chip disposed on the central portion, the second LED chip disposed on the peripheral portion, wherein the plurality of heat-conducting members is capable of reducing the temperature difference between the first LED chip and the second LED chip when the first and second LED chips are emitted;
wherein a heat conduction path is substantially constructed by the plurality of heat-conducting members, an electrical conduction path is constructed by the positive terminal and the negative terminal, thus the heat conduction path and the electrical conduction path are separated from each other.

12. The package structure of claim 11, wherein each of heat-conducting members is filled or coated with a heat-conducting material.

13. The package structure of claim 11, wherein the heat-conducting members have the same size and are spaced apart from each other, and the spacing of the heat-conducting members has a gradual reduction from an outer edge of the substrate toward a center of the substrate.

14. The package structure of claim 13, further defining a plurality of heat-dissipating regions X, Y, and Z, wherein the heat-dissipating regions X, Y, and Z extend radially outward in sequence having respective radial distances in a ratio of X:Y:Z=5:4:3, and wherein the heat-conducting members are radially spaced by separation distances A, B, and C in a ratio of A:B:C=3:4:5 from the center of the substrate.

15. The package structure for light-emitting diodes (LEDs) of claim 11, wherein the heat-conducting members have the same size and are spaced apart from each other, and the density of the heat-conducting members increases gradually from an outer edge of the substrate toward a center of the substrate.

16. The package structure for light-emitting diodes (LEDs) of claim 15, further defining the densities D1, D2, and D3 of the heat-conducting members in respectively heat-dissipating regions X, Y, and Z, wherein the heat-dissipating regions X, Y, and Z extend radially outward in sequence having respective radial distances in a ratio of X:Y:Z=5:4:3, and wherein the densities D1, D2, and D3 of the heat-conducting members corresponding to the heat-dissipating regions X, Y, and Z, respectively, are expressed by the ratio of D1:D2:D3=6.5:2:1.

17. The package structure for light-emitting diodes (LEDs) of claim 11, wherein the size of the heat-conducting members increases gradually from an outer edge of the substrate toward a center of the substrate.

18. The package structure for light-emitting diodes (LEDs) of claim 17, further defining the sizes S1, S2, and S3 of the heat-conducting members in respectively heat-dissipating regions X, Y and Z, wherein the heat-dissipating regions X, Y, and Z extend radially outward in sequence having respective radial distances in a ratio of 5:4:3, and wherein the sizes S1, S2, and S3 of the heat-conducting members corresponding to the heat-dissipating regions X, Y, and Z, respectively, are expressed by the ratio of S1:S2:S3=5:4:3.

19. A package structure, comprising:
a substrate having a plurality of heat-conducting members passing therethrough and a dielectric layer disposed on the top surface thereof;
a heat-dissipating structure disposed on the dielectric layer of the substrate, wherein the heat-dissipating structure has an inner portion and at least one outer portion, and the inner portion is capable of dissipating more heat than the outer portion; and
a plurality of LED chips disposed on the heat-dissipating structure and having at least one first LED chip and at least one second LED chip, the first LED chip disposed on the inner portion, the second LED chip disposed on the outer portion, wherein the heat-dissipating structure is capable of reducing the temperature difference between the first LED chip and the second LED chip when the first and second LED chips are emitted;
wherein the LED chips disposed on the heat-dissipating structure is electrically insulated from the plurality of heat-conducting members inside the substrate by the dielectric layer.

* * * * *